(12) United States Patent
Yoshida (10) Patent No.: US 9,304,212 B2
(45) Date of Patent: Apr. 5, 2016

(54) SCINTILLATOR PANEL AND MANUFACTURING METHOD THEREFOR AND RADIATION DETECTOR AND MANUFACTURING METHOD THEREFOR

(71) Applicants: Kabushiki Kaisha Toshiba, Minato-ku (JP); Toshiba Electron Tubes & Devices Co., Ltd., Otawara-shi (JP)

(72) Inventor: Atsuya Yoshida, Utsunomiya (JP)

(73) Assignees: Kabushiki Kaisha Toshiba, Minato-ku (JP); Toshiba Electron Tubes & Devices Co., Ltd., Otawara-shi (JP)

( * ) Notice: Subject to any disclaimer, the term of this patent is extended or adjusted under 35 U.S.C. 154(b) by 0 days.

(21) Appl. No.: 14/836,199

(22) Filed: Aug. 26, 2015

(65) Prior Publication Data

US 2015/0362602 A1    Dec. 17, 2015

Related U.S. Application Data

(63) Continuation of application No. PCT/JP2014/059835, filed on Apr. 3, 2014.

(30) Foreign Application Priority Data

Apr. 15, 2013   (JP) ................... 2013-084734

(51) Int. Cl.
*G01T 1/202*   (2006.01)
*G01T 1/20*    (2006.01)
(Continued)

(52) U.S. Cl.
CPC ............. *G01T 1/2018* (2013.01); *C09K 11/628* (2013.01); *G01T 1/202* (2013.01); *G21K 4/00* (2013.01); *H01L 31/18* (2013.01); *G21K 2004/06* (2013.01)

(58) Field of Classification Search
CPC .................................. G01T 1/20; G01T 1/202
See application file for complete search history.

(56) References Cited

U.S. PATENT DOCUMENTS 7,608,836 B2   10/2009   Wieczorek
2004/0033363 A1*  2/2004   Yano .................. C09K 11/7729
                                                                                428/411.1

(Continued)

FOREIGN PATENT DOCUMENTS

JP   2005-527826 A   9/2005
JP   2012-098110 A   5/2012

(Continued)

OTHER PUBLICATIONS

International Search Report issued Jul. 1, 2014 for PCT/JP2014/059835 filed on Apr. 3, 2014 with English Translation.

(Continued)

*Primary Examiner* — David Porta
*Assistant Examiner* — Faye Boosalis
(74) *Attorney, Agent, or Firm* — Oblon, McClelland, Maier & Neustadt, L.L.P.

(57) ABSTRACT

A scintillator panel is provided with a substrate which transmits radiation ray and a phosphor layer which is present on the surface of the substrate and which is made of a thallium-activated cesium iodide that can convert an incident radiation to visible light. The phosphor layer is covered with a moisture-proof film. The phosphor layer is an alternating laminate composed of high thallium concentration layers and low thallium concentration layers that have a thallium concentration lower than that of the high-thallium concentration layers, wherein the thickness of one thallium concentration cycle in the lamination direction is 40 nm or less.

4 Claims, 4 Drawing Sheets (51) Int. Cl.
  *G21K 4/00* (2006.01)
  *C09K 11/62* (2006.01)
  *H01L 31/18* (2006.01)

(56) References Cited

U.S. PATENT DOCUMENTS

2005/0199819 A1  9/2005  Wieczorek
2012/0097855 A1  4/2012  Kasai et al.
2012/0193540 A1  8/2012  Nakatsugawa et al.
2012/0193543 A1  8/2012  Kaneko et al.

FOREIGN PATENT DOCUMENTS

JP   2012-159393 A   8/2012
JP   2012-159394 A   8/2012
WO   WO 2010/150576 A1   12/2010

OTHER PUBLICATIONS

Written Opinion issued Jul. 1, 2014 for PCT/JP2014/059835 filed on Apr. 3, 2014.

* cited by examiner

SCINTILLATOR PANEL AND MANUFACTURING METHOD THEREFOR AND RADIATION DETECTOR AND MANUFACTURING METHOD THEREFOR

CROSS-REFERENCE TO RELATED APPLICATIONS

This application is based upon and claims the benefit of priority from Japanese Patent Application No. 2013-084734, filed on Apr. 15, 2013 and PCT Patent Application PCT/JP2014/059835, filed on Apr. 3, 2014; the entire contents of which are incorporated herein by reference.

FIELD

Embodiments described herein relate generally to a scintillator panel and a manufacturing method therefor and a radiation detector and a manufacturing method therefor.

BACKGROUND

As a digitized radiation detector for medical use, dental use, non-destructive inspection use, or the like, a detector using a system in which incident X-ray is once converted to visible light by a scintillator layer is the mainstream. In the scintillator layer, several types of materials are used, however, in a flat panel detector (hereinafter abbreviated as "FPD") for medical use, a device using a dental CMOS sensor, or a CCD-DR device for medical use/animal diagnostic use, thallium-activated cesium iodide (hereinafter abbreviated as "CsI/Tl") is used in many cases.

A CsI/Tl phosphor layer can be easily formed into a planar shape by a vacuum vapor deposition method. Moreover, by properly adjusting the deposition conditions, a film having a structure in which fiber crystals (column crystals) having a diameter of about 5 μm are arranged can be formed. By forming such a fiber structure, due to a difference in refractive index between the CsI crystal (refractive index=1.8) and a gap between the crystals (refractive index=1), fluorescence converted from radiation in one certain fiber reaches a surface of a sensor at a position which is not much deviated to a surface direction from the light emitting point. As a result, as a radiation image detecting device, a image which is not much blurred is obtained. That is, by forming the CsI/Tl phosphor layer under proper conditions, the CsI/Tl phosphor layer can simultaneously have a scintillation function to convert radiation to visible light and a fiber plate function to hold an image to the next sensor section.

A digital image detecting device for radiation images generally has a 17 inch (430 mm) square size in many cases. Even if the device has a smaller size than that, in response to the increase in the number of the devices accompanying the recent popularity of the digital devices, there is a tendency that many small-sized sensor panels are arranged in a vacuum vapor deposition device, and phosphor layers are formed at a time. Due to this, the size of the vacuum vapor deposition device and crucible is increased.

DETAILED DESCRIPTION

As one characteristic in a vapor deposition process for the CsI/Tl phosphor layer, the layer is formed while mixing CsI and TlI in a gas phase. Unless TlI is mixed in CsI uniformly at a desired concentration, a proper sensitivity characteristic cannot be obtained. The TlI vapor pressure is much higher than the CsI vapor pressure, and therefore, even if vapor deposition is performed by merely mixing and placing both materials in one crucible, a proper concentration distribution cannot be obtained.

For example, when a substrate and a CsI crucible are disposed so as to face each other in a vacuum vapor deposition machine, and vapor deposition is performed by heating the CsI crucible in which CsI in a necessary amount for obtaining a desired film thickness and a small amount of TlI are placed to a temperature of 700° C. while rotating the substrate, at an initial stage of vapor deposition, in short, TlI is concentrated in the vicinity of the substrate, and therefore, at an end stage of vapor deposition, TlI is brought to a state of being almost used up. In this case, a portion far from the substrate, that is, a portion on a vapor deposition surface side almost does not emit light even if X-ray is irradiated, and therefore, the sensitivity characteristic as a scintillation panel is deteriorated. Accordingly, it is important that the concentration of TlI in the phosphor layer is made uniform.

Further, as an important requirement for imparting a proper scintillation function to the CsI/Tl phosphor layer, there is a sensitivity ghost characteristic. The sensitivity ghost is a phenomenon that when a scintillator is once irradiated with X-ray, an afterglow remains for long period only in an irradiated portion. X-ray which has been passed through an object once is irradiated on a scintillator, and further, an X-ray image is captured again at a relatively short interval (for example, 5 minutes), an afterglow image at the time of previous irradiation overlaps with the image captured this time, resulting in hindering the diagnosis.

Accordingly, an object of an embodiment is to decrease a sensitivity ghost on a scintillator panel which converts radiation to visible light.

According to one embodiment, a scintillator panel, which includes: a substrate through which radiation ray is transmitted; and a phosphor layer which is provided on a surface of the substrate, converts incident radiation to visible light, and is formed from thallium-activated cesium iodide, and in which the phosphor layer is obtained by alternately stacking a high thallium concentration layer and a low thallium concentration layer having a lower thallium concentration than the high thallium concentration layer, and has a period of the thallium concentration in a stacking direction of 40 nm or less.

According to another embodiment, a method for manufacturing a scintillator panel, which includes: disposing a substrate through which visible light is transmitted, a first crucible in which CsI is placed, and a second crucible in which TlI is placed in a vacuum chamber so that the substrate faces the first crucible and the second crucible, and forming a phosphor layer of thallium-activated cesium iodide on a surface of the substrate by heating the first crucible and the second crucible while rotating the substrate, and in which when a rotation speed of the substrate is represented by R (rpm), a deposition rate of the scintillator layer on the substrate is represented by T (nm/min), T/R<40 nm.

According to another embodiment, a radiation detector, which includes: a photoelectric conversion panel in which a sensor that converts visible light to an electric signal is disposed; a scintillator layer which is provided on a surface of the photoelectric conversion panel, converts incident radiation to visible light, and is formed from thallium-activated cesium iodide, and in which the scintillator layer is obtained by alternately stacking a high thallium concentration layer and a low thallium concentration layer having a lower thallium concentration than the high thallium concentration layer, and has a period of the thallium concentration in a stacking direction of 40 nm or less.

According to another embodiment, a method for manufacturing a radiation detector, which includes: disposing a photoelectric conversion panel through which visible light is transmitted and in which a sensor that converts the visible light to an electric signal is disposed, a first crucible in which CsI is placed, and a second crucible in which TlI is placed in a vacuum chamber so that the photoelectric conversion panel faces the first crucible and the second crucible, and forming a scintillator layer of thallium-activated cesium iodide on a surface of the photoelectric conversion panel by heating the first crucible and the second crucible while rotating the photoelectric conversion panel, and in which when a rotation speed of the substrate is represented by R (rpm), a deposition rate of the scintillator layer on the photoelectric conversion panel is represented by T (nm/min), T/R<40 nm.

According to another embodiment, a scintillator panel, which includes: a substrate through which radiation ray is transmitted; and a scintillator layer which is provided on a surface of the substrate, converts incident radiation to visible light, and is formed from thallium-activated cesium iodide, and in which the scintillator layer is obtained by alternately stacking a high thallium concentration layer and a low thallium concentration layer having a lower thallium concentration than the high thallium concentration layer.

Hereinafter, a scintillator panel and a radiation detector according to one embodiment will be described with reference to the drawings. Incidentally, the same or similar configurations are denoted by the same reference numerals and repeated description thereof will be omitted.

Figure 1:
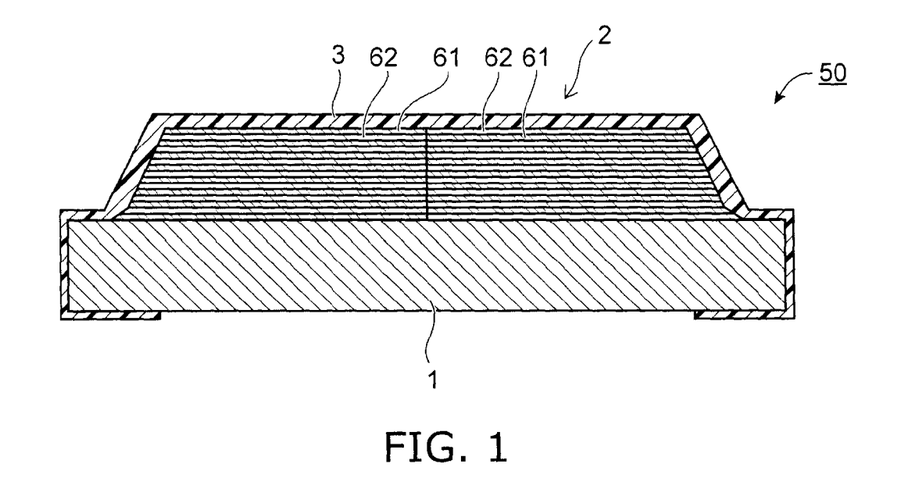
FIG. 1 is a cross-sectional view of a scintillator panel according to one embodiment.

FIG. 1 is a cross-sectional view of a scintillator panel according to one embodiment.

A scintillator panel 50 includes a substrate 1, a phosphor layer 2, and a moisture-proof film 3. The substrate 1 is a flat plate composed mainly of, for example, carbon fibers. The substrate 1 transmits the radiation ray. The phosphor layer 2 is a layer of thallium-activated cesium iodide (Tl-activated CsI) formed on one surface of the substrate 1. The moisture-proof film 3 is, for example, a vapor deposition polymerization film of polyparaxylylene formed on a surface of the phosphor layer 2.

Figure 2:
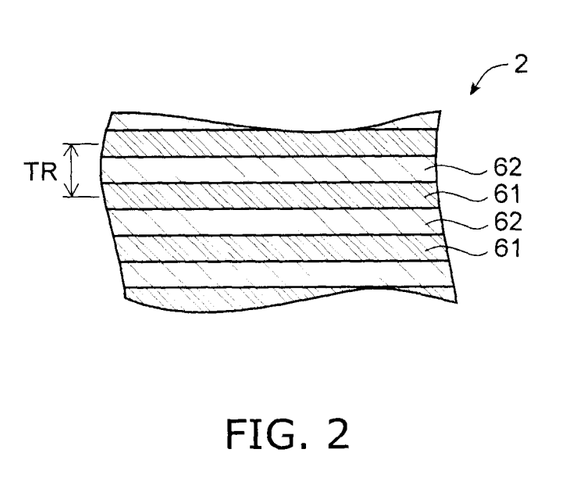
FIG. 2 is a partially enlarged cross-sectional view of the phosphor layer according to one embodiment.
Figure 3:
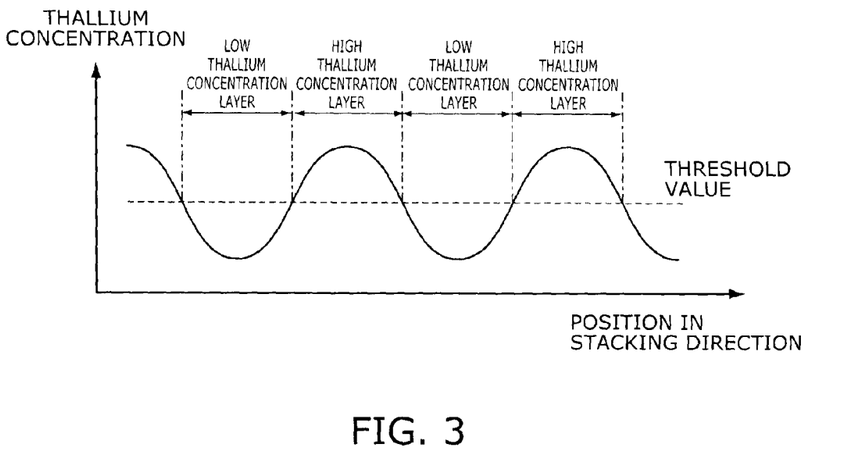
FIG. 3 is a graph of a thallium concentration in the phosphor layer according to one embodiment.

FIG. 2 is a partially enlarged cross-sectional view of the phosphor layer according to one embodiment. FIG. 3 is a graph of a thallium concentration in the phosphor layer according to one embodiment. In this graph, the abscissa represents a stacking direction of a position of a high thallium concentration layer 61 and a low thallium concentration layer 62, that is, a distance from the substrate 1.

In the phosphor layer 2, the thallium concentration periodically and continuously increases and decreases repeatedly with the distance from the substrate 1. As a result, when a predetermined value of the Tl concentration is defined as a threshold value, and a region where the Tl concentration is higher than the threshold value is defined as the high thallium concentration layer 61, and a region where the Tl concentration is lower than the threshold value is defined as the low thallium concentration layer 62, in the phosphor layer 2, the high thallium concentration layer 61 and the low thallium concentration layer 62 are repeatedly stacked on each other in the normal direction of the substrate 1.

Incidentally, as shown in FIG. 1, a position of the high thallium concentration layer 61 in the stacking direction or a position of the low thallium concentration layer 62 in the stacking direction is different depending on a region in a planar direction of the phosphor layer 2 (for example, a region in a horizontal direction in FIG. 1).

Figure 6:
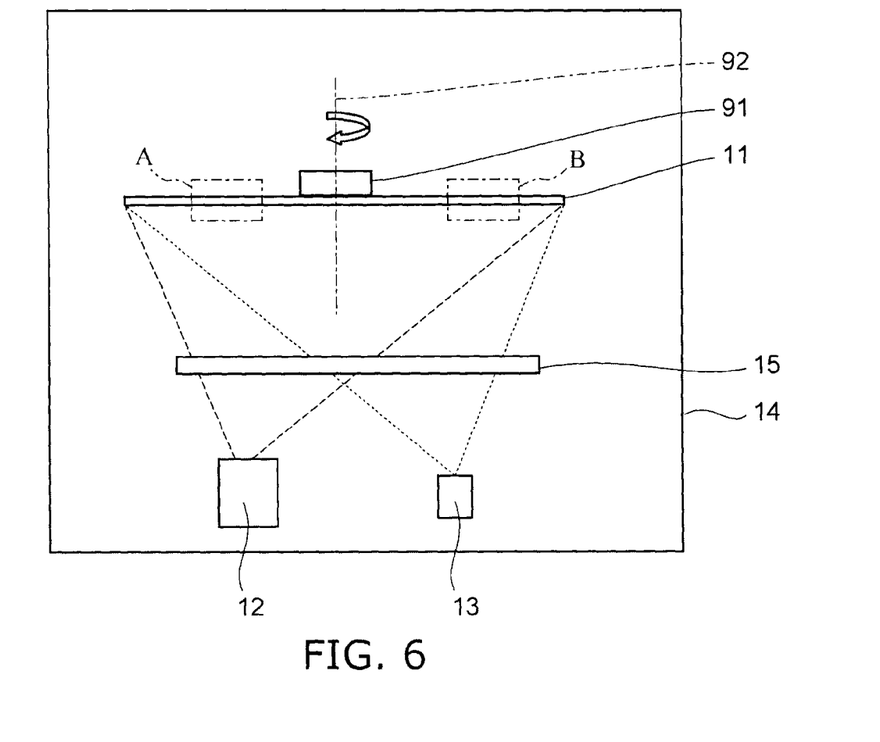
FIG. 6 is a schematic side view of a phosphor layer forming device according to the embodiment.

As shown in FIG. 6, which will be described later, a first crucible 12 for generating CsI vapor and a second crucible 13 for generating TlI vapor are disposed so as to face the substrate 11, respectively.

Due to this, when the phosphor layer 2 is formed, the high thallium concentration layer 61 is formed in a region closer to the second crucible 13, and the low thallium concentration layer 62 is formed in a region closer to the first crucible 12 adjacent thereto.

Then, as the rotation of the substrate 11, the region where the high thallium concentration layer 61 is formed and the region where the low thallium concentration layer 62 is formed move.

Due to this, in the region closer to the second crucible 13, the high thallium concentration layer 61 is formed on the low thallium concentration layer 62, and in the region closer to the first crucible 12 adjacent thereto, the low thallium concentration layer 62 is formed on the high thallium concentration layer 61.

As a result, the position of the high thallium concentration layer 61 in the stacking direction or the position of the low thallium concentration layer 62 in the stacking direction are different depending on the region in the planar direction of the phosphor layer 2.

Figure 4:
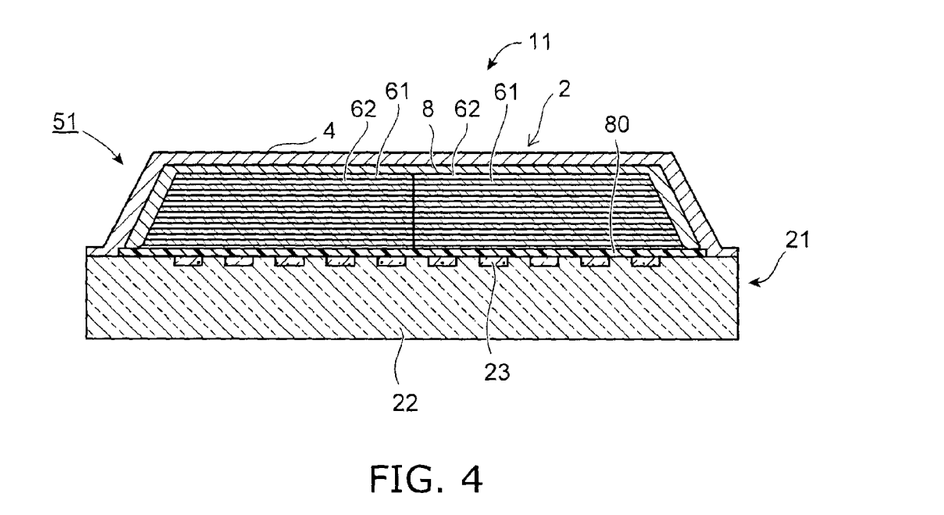
FIG. 4 is a cross-sectional view of a radiation detector according to one embodiment.
Figure 5:
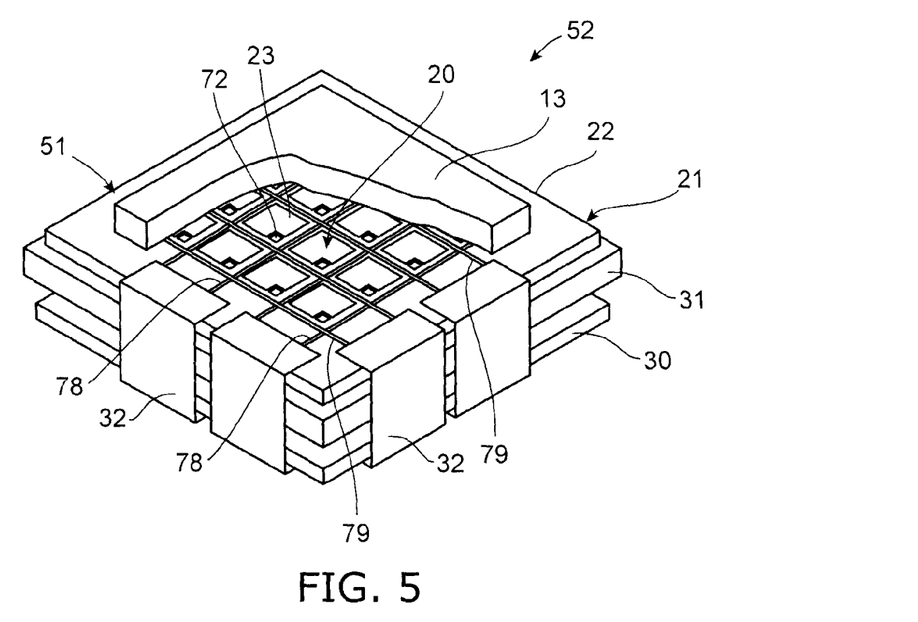
FIG. 5 is a schematic perspective view of the radiation detection device according to one embodiment.

FIG. 4 is a cross-sectional view of a radiation detector according to one embodiment. FIG. 5 is a schematic perspective view of the radiation detection device according to one embodiment.

A radiation detector 51 is an X-ray plane sensor which detects an X-ray image that is a radiation image, and is used for, for example, general medical purposes. A radiation detection device 52 includes this radiation detector 51, a support plate 31, a circuit board 30, and a flexible substrate 32. The radiation detector 51 includes a photoelectric conversion panel 21, the phosphor layer 2, a reflection film 8, and a moisture-proof cap 4. Incidentally, in FIG. 5, illustration of the reflection film 8 and the moisture-proof cap 4 is omitted.

The radiation detector 51 detects incident X-ray and converts the X-ray to fluorescence, and then converts the fluorescence to an electric signal. The radiation detection device 52 drives the radiation detector 51 and outputs the electric signal output from the radiation detector 51 as image information. The image information output by the radiation detection device 52 is displayed on an external display or the like.

The photoelectric conversion panel 21 includes a glass substrate 22. On the surface of the glass substrate 22, multiple fine pixels 20 are arranged in a square grid. Each of the pixels 20 includes a thin-film transistor 72 and a photoelectric conversion element 23. The photoelectric conversion element 23 is, for example, a photodiode, and converts visible light to an electric charge. Each photoelectric conversion element 23 is provided with a capacitor that stores the generated electric charge.

Further, on the surface of the glass substrate 22, the same number of row selection lines 78 as the number of the rows of the square grid in which the pixels 20 are arranged extend between the respective pixels 20. Further, on the surface of the glass substrate 22, the same number of signal lines 79 as the number of the columns of the square grid in which the pixels 20 are arranged extend between the respective pixels 20. The phosphor layer 2 is formed on the surface of an effective pixel region in which the pixels 20 of the photoelectric conversion panel 21 are arranged. On the surface of the photoelectric conversion panel 21, an insulating protective film 80 is formed. Incidentally, in FIG. 4, illustration of the thin-film transistor 72, row selection lines 78, signal lines 79, and the like is omitted.

The thin-film transistor 72 functions as a switching element that allows the stored electric charge to flow to a signal line as an electric signal according to a row selection signal given from the row selection line. In the embodiment, as the sensor including the photoelectric conversion element, a sensor in which a TFT and a photodiode are formed on a glass substrate is adopted, however, a CMOS or a CCD may be adopted.

The phosphor layer 2 is provided on the surface of the photoelectric conversion panel 21, and when X-ray is incident, fluorescence in a visible light region is generated. The generated fluorescence reaches the surface of the photoelectric conversion panel 21.

The photoelectric conversion panel 21 receives fluorescence generated by the phosphor layer 2 and generates an electric signal. As a result, a visible light image generated in the phosphor layer 2 by the incident X-ray is converted to image information represented by an electric signal.

The radiation detector 51 is supported by the support plate 31 such that a surface on an opposite side to the surface where the phosphor layer 2 is formed comes in contact with the support plate 31. The circuit board 30 is disposed on the opposite side of the support plate 31 to the radiation detector 51. The radiation detector 51 and the circuit board 30 are electrically connected to each other through the flexible substrate 32.

The phosphor layer 2 is a layer of thallium-activated cesium iodide (Tl-activated CsI) formed on one surface of the photoelectric conversion panel 21 in the same manner as shown in FIGS. 1 and 2. The reflection film 8 is composed of a resin paste in which titanium oxide ($TiO_2$) particles are dispersed, and is provided on the opposite side of the phosphor layer 2 to the photoelectric conversion panel 21. The reflection film 8 reflects the fluorescence generated by the phosphor layer 2 to the side of the photoelectric conversion panel 21. The moisture-proof cap 4 is formed from an aluminum (Al) thin plate into a shape of a hat with a brim. The moisture-proof cap 4 covers the phosphor layer 2 and the reflection film 8, and the brim portion is adhered to the photoelectric conversion panel 21.

FIG. 6 is a schematic side view of a phosphor layer forming device according to the embodiment.

This phosphor layer forming machine includes a vacuum chamber 14, the first crucible 12, the second crucible 13, a shutter 15, and a rotation mechanism 91. The first crucible 12, the second crucible 13, and the rotation mechanism 91 are disposed in the inside the vacuum chamber 14.

To the rotation mechanism 91, a substrate 11 is fixed. Here, the substrate 11 is the substrate 1 of the scintillator panel 50 (see FIG. 1) or the photoelectric conversion panel 21 of the radiation detector 51 (see FIG. 4). The rotation mechanism 91 rotates the substrate 11 with the normal line of the surface in the vicinity of the center of the substrate 11 as an axis 92.

In the first crucible 12, CsI is placed in an amount of, for example, 11,000 g. In the second crucible 13, TlI is placed in an amount of, for example, 50 g. The first crucible 12 and the second crucible 13 are disposed so as to face the substrate 11. Between the substrate 11 and each of the first crucible 12 and the second crucible 13, the shutter 15 is disposed.

First, a gas in the inside of the vacuum chamber 14 is discharged with a pump (not shown), and the pressure is decreased to reach $5 \times 10^{-4}$ Pa. In this state, the first crucible 12, the second crucible 13, and the substrate 11 are preheated with a heating unit (not shown), and the temperatures of the respective members are increased to reach 700° C., 400° C., and 150° C., respectively.

Subsequently, while rotating the substrate 11, when the temperatures of the respective members reach the desired temperatures, respectively, and CsI in the first crucible 12 and TlI in the second crucible 13 are brought to a state of being vaporized stably, the shutter 15 escapes. By doing this, CsI vapor and TlI vapor reach the substrate 11 in a state where the CsI vapor and the TlI vapor are mixed in a gas phase. On the surface of the substrate 11, CsI vapor is denser, and therefore, a CsI crystal is formed, and Tl ions are disposed at a site where some Cs ions are originally disposed, and as a result, Tl is added to a CsI mother crystal in such a form that the CsI mother crystal is not destroyed. Thereafter, processes of applying a reflection film, a moisture-proof film, etc. are performed, and a necessary circuit and housing are assembled, whereby a scintillator panel or a radiation detector is completed.

In this manner, crucibles for CsI and TlI are prepared separately, and heated to different temperatures, respectively, for example, CsI is heated to 700° C., TlI is heated to 400° C., a desired mixing ratio is obtained, and CsI and TlI are simultaneously deposited, whereby the deposition rates of both CsI and TlI become constant macroscopically. As a result, the macroscopic TlI concentration in the stacking direction in the phosphor layer becomes constant, and thus, a favorable sensitivity characteristic is obtained.

However, the concentration of Tl to be added onto the substrate 11 periodically increases and decreases microscopically according to the rotation of the substrate 11. There are following two reasons why the concentration of Tl to be added onto the substrate 11 periodically increases and decreases according to the rotation of the substrate 11.

The first reason is that it is caused by a distance between the substrate 11 and each of the first crucible 12 in which CsI is placed and the second crucible 13 in which TlI is placed. A region A on an upper side of the first crucible 12 on the left side of the rotation axis 92 on the substrate 11 in FIG. 6 is relatively closer to the first crucible 12 in which CsI is placed and is relatively farther from the second crucible 13 in which TlI is placed. As a result, the TlI concentration becomes low. On the other hand, in a region B on an upper side of the second crucible 13 on the right side of the rotation axis 92 in FIG. 6, the TlI concentration becomes high on the contrary. While rotating the substrate 11, a certain portion on the substrate 11 alternately passes through the region A and the region B, in other words, alternately passes through a region closer to the first crucible 12 and a region closer to the second crucible 13. Therefore, a TlI concentration contrast according to the rotation period of the substrate 11 is formed.

Figure 7:
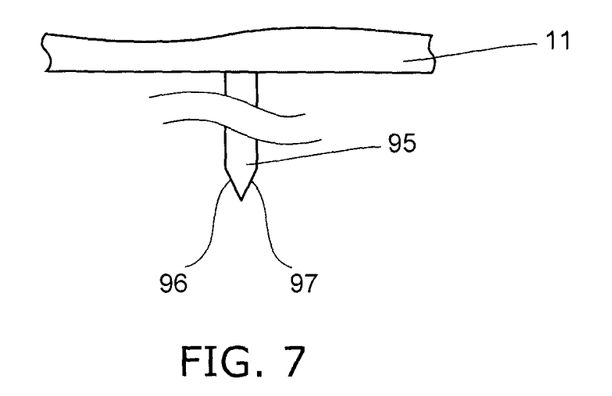
FIG. 7 is a schematically enlarged cross-sectional view of one fiber structure of the CsI crystal in the middle of the formation of the phosphor layer according to the embodiment.

The second reason is that it is caused by the tip shape of the CsI crystal and a difference in the angle between the surface of the CsI crystal and each of the CsI crucible and the TlI crucible. The CsI crystal forms an assembly of fiber structures in the gas phase.

FIG. 7 is a schematically enlarged cross-sectional view of one fiber structure of the CsI crystal in the middle of the formation of the phosphor layer according to the embodiment.

When an assembly of fiber structures is formed in the gas phase, a CsI crystal 95 has a tip portion with a sharp-pointed shape. There exist a portion 96 facing the first crucible 12 in which CsI is placed and a portion 97 facing the second crucible 13 in which TlI is placed, and these portions become a low Tl concentration portion and a high Tl concentration portion, respectively. As a result, a TlI concentration contrast according to the rotation period of the substrate 11 is formed.

In either of the cases of the above-mentioned two reasons, when the deposition rate of the CsI phosphor layer is represented by T (nm/min), and the rotation speed is represented by R (rpm), this contrast period is represented by T/R (nm). That is, a variation period of the Tl concentration in the stacking direction in the phosphor layer 2 is in inverse proportion to the rotation speed of the substrate 11.

Figure 8:
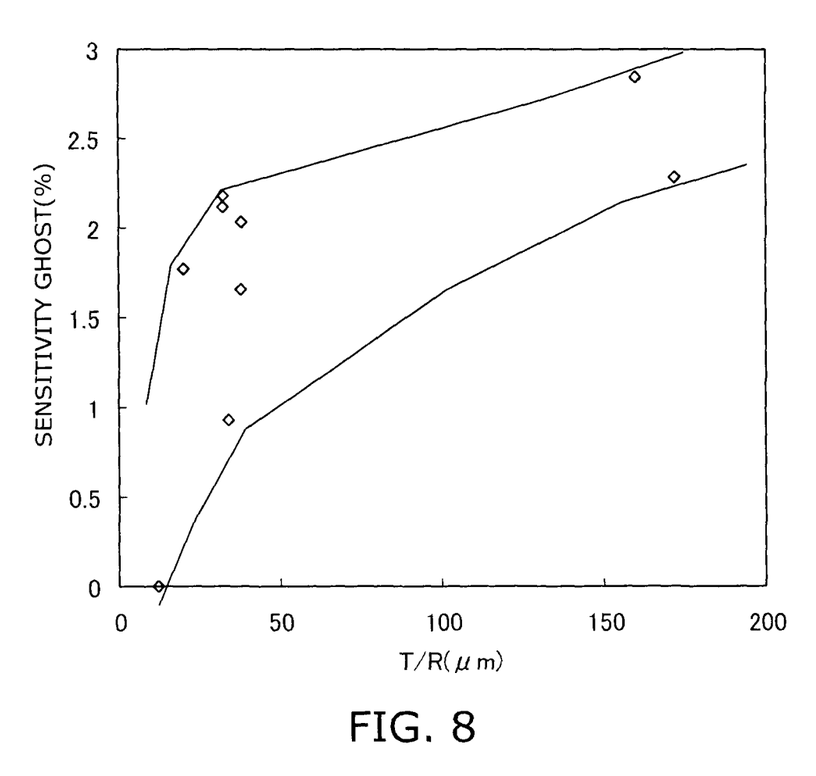
FIG. 8 is a test result of a sensitivity ghost in the radiation detector according to the embodiment.

FIG. 8 is a test result of a sensitivity ghost in the radiation detector according to the embodiment. This test is a measurement result of a sensitivity ghost in the radiation detector by changing a ratio of the deposition rate of the CsI phosphor layer to the rotation speed, that is, the value of T/R.

The sensitivity ghost was evaluated as follows. A high dose (2,400 mAs) of X-ray was irradiated in a state where an object that shields X-ray is disposed between the radiation detector and the X-ray generator, and after 5 minutes, a white image was captured under common image capturing conditions (16 mAs) in a state where the object was removed. Then, the sensitivity ghost was evaluated as the increment of a signal amount in a portion having a high-dose irradiation history with respect to a signal amount in a portion having no irradiation history before capturing the image. That is, when the sensitivity ghost is represented by GS (%), the signal amount in the portion having no irradiation history before capturing the image, that is, the sensitivity in the non-irradiation portion is represented by S0, and the sensitivity in the portion having a high-dose irradiation history is represented by S1, the following formula is established.

$$GS(\%)=(S1-S0)/S0\times 100$$

The fluorescent phenomenon of CsI/Tl occurs such that X-ray absorbed by the CsI crystal is converted to high-speed electrons, and the high-speed electrons sequentially excite electrons in the valence band in the crystal while the high-speed electrons decelerate themselves, and the excited electrons pass through the luminescence center composed of Tl ions scattered in the crystal, whereby light is emitted promptly. In the case where Tl ions are not present nearby, the excitation energy remains in the phosphor layer, and the energy is not easily released as light emission. Then, by receiving stimulation from high-speed electrons newly generated by absorbing X-ray in the subsequent frame, light is emitted as a ghost.

As shown in FIG. 8, when the rotation speed of the substrate was set to 6 rpm, the deposition rate was set to 1 µm/min, T/R was about 170 µm, and an average TlI concentration in the stacking direction was set to 0.5%, sufficient sensitivity was obtained, however, the sensitivity ghost (GS) was from 2.3 to 2.8%. When the sensitivity ghost occurs to such a degree, a previous irradiation image ghost covers a normal-dose image after a high-dose irradiation, and thus, image diagnosis may be hindered.

On the other hand, when the rotation speed was set to 30 rpm (at this time, T/R was about 35 µm), the sensitivity ghost was from 0.9 to 2.2%, so that improvement was observed. Further, when the deposition rate was set to 0.14 µm/min, and the rotation speed of the substrate was set to 12 rpm (at this time, T/R was about 12 µm), the sensitivity ghost was 0%.

It was found that by decreasing the ratio of the deposition rate of the phosphor layer 2 to the rotation speed, that is, by decreasing the value of T/R in this manner, the sensitivity ghost is decreased. In the case of a system in which vapor deposition is performed using two crucibles for CsI and TlI, it is unavoidable that the Tl concentration in the phosphor layer is decreased, that is, a region where Tl is lacking is formed. However, by narrowing this region where Tl in the phosphor layer is lacking, the probability that excited electrons encounter the luminescence center of Tl is increased, and therefore, the sensitivity ghost can be decreased.

Accordingly, in the embodiment, based on the result of the experiment shown in FIG. 8, the ratio of the deposition rate of the phosphor layer 2 to the rotation speed (T/R) is set to 40 nm or less at which the sensitivity ghost is decreased. That is, the phosphor layer 2 is configured such that it is obtained by alternately stacking the high thallium concentration layer 61 and the low thallium concentration layer 62, and the period of the thallium concentration in the stacking direction is set to 40 nm or less.

Further, the ratio of the deposition rate of the phosphor layer 2 to the rotation speed (T/R) is preferably set to 15 nm or less. In this case, the period of the thallium concentration in the stacking direction in the phosphor layer 2 becomes 40 nm or less.

In this manner, according to the embodiment, the sensitivity ghost in the scintillator panel which converts radiation to visible light can be decreased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A scintillator panel, which comprises:
   a substrate through which radiation ray is transmitted; and
   a phosphor layer which is provided on a surface of the substrate, converts incident radiation to visible light, and is formed from thallium-activated cesium iodide, and in which
   the phosphor layer is obtained by alternately stacking a high thallium concentration layer and a low thallium concentration layer having a lower thallium concentration than the high thallium concentration layer, and has a period of the thallium concentration in a stacking direction of 40 nm or less.

2. The panel according to claim 1, wherein the period is 15 nm or less.

3. A radiation detector, which comprises:
   a photoelectric conversion panel in which a sensor that converts visible light to an electric signal is disposed;
   a scintillator layer which is provided on a surface of the photoelectric conversion panel, converts incident radiation to visible light, and is formed from thallium-activated cesium iodide, and in which the scintillator layer is obtained by alternately stacking a high thallium concentration layer and a low thallium concentration layer having a lower thallium concentration than the high thallium concentration layer, and has a period of the thallium concentration in a stacking direction of 40 nm or less.

4. A scintillator panel, which comprises:

a substrate through which radiation ray is transmitted; and a scintillator layer which is provided on a surface of the substrate, converts incident radiation to visible light, and is formed from thallium-activated cesium iodide, and in which the scintillator layer is obtained by alternately stacking a high thallium concentration layer and a low thallium concentration layer having a lower thallium concentration than the high thallium concentration layer.

* * * * *